(12) United States Patent
Sunohara et al.

(10) Patent No.: US 8,309,860 B2
(45) Date of Patent: Nov. 13, 2012

(54) ELECTRONIC COMPONENT BUILT-IN SUBSTRATE AND METHOD OF MANUFACTURING THE SAME

(75) Inventors: Masahiro Sunohara, Nagano (JP); Hideaki Sakaguchi, Nagano (JP); Hiroshi Shimizu, Nagano (JP)

(73) Assignee: Shinko Electric Industries Co., Ltd., Nagano-Shi (JP)

(*) Notice: Subject to any disclaimer, the term of this patent is extended or adjusted under 35 U.S.C. 154(b) by 376 days.

(21) Appl. No.: 12/605,736

(22) Filed: Oct. 26, 2009

(65) Prior Publication Data
US 2010/0101849 A1 Apr. 29, 2010

(30) Foreign Application Priority Data
Oct. 27, 2008 (JP) ................................. 2008-275290

(51) Int. Cl.
H05K 1/16 (2006.01)
H05K 1/18 (2006.01)

(52) U.S. Cl. ........................................ 174/260; 361/761
(58) Field of Classification Search .................. 361/761, 361/762, 763, 764, 772; 174/260, 261; 257/698, 257/707
See application file for complete search history.

(56) References Cited

U.S. PATENT DOCUMENTS

| | | | |
|---|---|---|---|
| 5,432,677 A * | 7/1995 | Mowatt et al. | ................ 174/252 |
| 6,603,191 B2 | 8/2003 | Wakabayashi | |
| 7,217,888 B2 | 5/2007 | Sunohara | |
| 7,530,163 B2 | 5/2009 | Sunohara | |
| 7,906,370 B2 | 3/2011 | Morita | |
| 2001/0013425 A1* | 8/2001 | Rokugawa et al. | ........... 174/262 |
| 2004/0014317 A1 | 1/2004 | Sakamoto | |
| 2004/0113260 A1* | 6/2004 | Sunohara et al. | ............. 257/698 |
| 2007/0209831 A1 | 9/2007 | Sakamoto | |
| 2008/0148563 A1 | 6/2008 | Sakamoto | |
| 2008/0151522 A1 | 6/2008 | Sakamoto | |
| 2008/0169123 A1 | 7/2008 | Sakamoto | |
| 2008/0206926 A1 | 8/2008 | Sakamoto | |
| 2008/0211086 A1 | 9/2008 | Morita | |
| 2008/0230914 A1 | 9/2008 | Sakamoto | |
| 2009/0077796 A1 | 3/2009 | Sakamoto | |

FOREIGN PATENT DOCUMENTS

| | | |
|---|---|---|
| JP | 2000-323645 | 11/2000 |
| JP | 2001-332643 A1 | 11/2001 |
| JP | 2002-246757 A1 | 8/2002 |
| JP | 2004-47725 A1 | 2/2004 |
| JP | 2004-179288 A1 | 6/2004 |
| JP | 2008-159819 A | 7/2008 |

* cited by examiner

Primary Examiner — Timothy Thompson
Assistant Examiner — Roshn Varghese
(74) Attorney, Agent, or Firm — Kratz, Quintos & Hanson, LLP

(57) ABSTRACT

A method of manufacturing an electronic component built-in substrate, includes the steps of mounting a chip-like electronic component having a connection pad and a metal protection layer formed on a whole of one surface to cover the connection pad, on a wiring substrate to direct the connection pad upward; embedding the electronic component with the insulating layer; processing the insulating layer in a thickness direction to leave the insulating layer in a side of the electronic component and to expose the metal protection layer of the electronic component; and forming an upper wiring layer having an in-chip wiring part which is connected to the connection pad and contacts an upper surface of the electronic component and is constructed by an underlying metal pattern layer formed by patterning the metal protection layer and a conductive pattern layer formed thereon, and an extended wiring part which is connected to the in-chip wiring part to extend onto the insulating layer and is formed by an identical layer as the conductive pattern layer.

5 Claims, 17 Drawing Sheets

ELECTRONIC COMPONENT BUILT-IN SUBSTRATE AND METHOD OF MANUFACTURING THE SAME

CROSS-REFERENCE TO RELATED APPLICATIONS

This application is based on and claims priority of Japanese Patent Application No. 2008-275290 filed on Oct. 27, 2009, the entire contents of which are incorporated herein by reference.

BACKGROUND OF THE INVENTION

1. Field of the Invention

The present invention relates to an electronic component built-in substrate in which an electronic component such as a semiconductor chip, or the like is built, and a method of manufacturing the same.

2. Description of the Related Art

In the prior art, there are various electronic component built-in substrates in which an electronic component such as a semiconductor chip, or the like is built. In such electronic component built-in substrates, a semiconductor chip is mounted on a wiring substrate and then the semiconductor chip is embedded in an insulating layer, and then vias reaching a connection pad of the semiconductor chip respectively are opened by the laser or the photolithography and then the semiconductor chip is connected electrically to the wiring substrate via the vias (Patent Literature 1 (Patent Application Publication (KOKAI) 2004-179288) and Patent Literature 2 (Patent Application Publication (KOKAI) 2002-246757)).

In Patent Literature 3 (Patent Application Publication (KOKAI) 2001-332643), the method of mounting a semiconductor chip in which copper posts are formed on a wiring substrate, then embedding the semiconductor chip in an insulating layer, and then exposing the copper posts by polishing the insulating layer is set forth.

Also, in Patent Literature 4 (Patent Application Publication (KOKAI) 2000-323645), it is set forth that a semiconductor element is mounted on wiring layers of a wiring substrate to direct its function surface to the upper side, then an insulating layer whose thickness is substantially equal to the semiconductor element is formed such that the function surface of the semiconductor element is exposed, and then connection patterns extended from an electrode terminal of the semiconductor element onto the insulating layer respectively are formed.

Also, in Patent Literature 5 (Patent Application Publication (KOKAI) 2004-47725), it is set forth that a rewiring circuit is formed by pasting a conductor layer built-in dry film onto a semiconductor wafer, on which stud bumps are formed, to make the stud bumps penetrate a conductor layer, then exposing the stud bumps by peeling off a base film, and then forming an electroplating copper layer and patterning the layer.

As explained in the column of related art described later, in the case of the method of forming the via holes in the insulating layer in which the semiconductor chip is embedded by the laser, a laser stop layer for protecting the semiconductor chip from the laser must be formed to be made patterns on the connection pads of the semiconductor chip. In this case, such a problem exists that, since the stop layer is formed via complicated steps in a state of a semiconductor wafer, various manufacturing equipments for wafer processes are needed on the mounting line to cause an increase in cost.

Also, in the method of exposing the copper posts of the semiconductor chip by polishing the insulating layer (Patent Literature 3), since the copper posts must be formed similarly in a state of the semiconductor wafer, it is feared that an increase in cost is caused.

SUMMARY OF THE INVENTION

It is an object of the present invention to provide an electronic component built-in substrate that can be manufactured by a simple method at a low cost, and a method of manufacturing the same.

The present invention is concerned with a method of manufacturing an electronic component built-in substrate, which includes the steps of: mounting an electronic component having a connection pad and a metal protection layer covering the connection pad and formed on a whole of one surface, on a wiring substrate to direct the connection pad upward; embedding the electronic component with an insulating layer by forming the insulating layer on the wiring substrate and the electronic component; processing the insulating layer in a thickness direction to leave the insulating layer in a side of the electronic component and to expose the metal protection layer of the electronic component; and forming an upper wiring layer including an in-chip wiring part which is connected to the connection pad and contacts an upper surface of the electronic component and is constructed by an underlying metal pattern layer formed by patterning the metal protection layer and a conductive pattern layer formed thereon, and an extended wiring part which is connected to the in-chip wiring part to extend onto the insulating layer and is formed by an identical layer with the conductive pattern layer.

In the present invention, first, the electronic component (the semiconductor chip, or the like), which has the connection pad and the metal protection layer formed on the whole of one surface to cover the connection pad, is prepared, and then the electronic component is mounted on the wiring substrate to direct the connection pad upward.

Then, the whole of the electronic component is embedded in the insulating layer, and then the insulating layer is processed in the thickness direction to leave the insulating layer on the side of the electronic component and expose the metal protection layer of the electronic component. In the preferred mode, the insulating layer (resin) is etched by the oxygen plasma.

Then, the in-chip wiring part that is constructed by the underlying metal pattern layer being formed by patterning the metal protection layer and the conductive pattern layer formed thereon is formed on the electronic component, and the extended wiring part which is connected to the in-chip wiring part and is formed by the identical layer as the conductive pattern layer is formed to extend on the insulating layer. The in-chip wiring part is connected to the connection pad in a state that the in-chip wiring part contacts the upper surface of the electronic component.

In the present invention, the metal protection layer is provided on the whole of the upper surface of the electronic component. Therefore, the upper surface of the electronic component can be exposed without giving damage to the electronic component by processing the insulating layer in which the electronic component is embedded.

Accordingly, the fan-out wirings (upper wiring layers) can be formed to extend from the electronic component onto the insulating layer on the outside in a state such fan-out wirings contact the upper surface of the electronic component. Therefore, unlike the relates art described later, there is no necessity that the via holes are formed in the insulating layer which covers the electronic component by the laser and that the upper wiring layers are formed to raise upward from the via holes.

As a result, since the wiring structure can be made simple rather than the related art, a manufacturing cost can be reduced. In addition, since a wiring length can be made short in contrast to the related art, the electric characteristics of the wiring substrate can be improved.

Further, no laser via is formed on the semiconductor chip. Therefore, even when the semiconductor chip which is weak against a heat is employed, the semiconductor chip never receives thermal damage, and reliability can be improved.

Also, in the present invention, the electronic component having the metal protection layer is mounted on the wiring substrate, and then the metal protection layer is patterned simultaneously in the step of forming the upper wiring layer and is utilized as a part of the upper wiring layer. For this reason, unlike the method of forming by patterning the stop layer for the laser processing in a wafer state, there is no need to introduce various manufacturing equipments for wafer processes on the mounting line. Therefore, the equipment investment can be suppressed.

Also, in the case that the insulating layer is etched by the oxygen plasma to expose the electronic component, there is no need to introduce the polishing equipment. Therefore, the manufacturing equipments in the existing mounting line can respond to the present invention, a reduction in cost can be attained.

As explained above, in the present invention, the electronic component built-in substrate can be manufactured by a simple method at a low cost.

DETAILED DESCRIPTION OF THE PREFERRED EMBODIMENTS

Embodiments of the present invention will be explained with reference to the accompanying drawings hereinafter.

Related Art

Prior to the explanation of a method of manufacturing an electronic component built-in substrate according to embodiments of the present invention, the problem of the related art associated with the present invention will be explained hereunder. FIGS. 1A to 1D, FIGS. 2A to 2C, and FIGS. 3A and 3B are sectional views showing a method of manufacturing an electronic component built-in substrate in the related art.

Figure 1A:
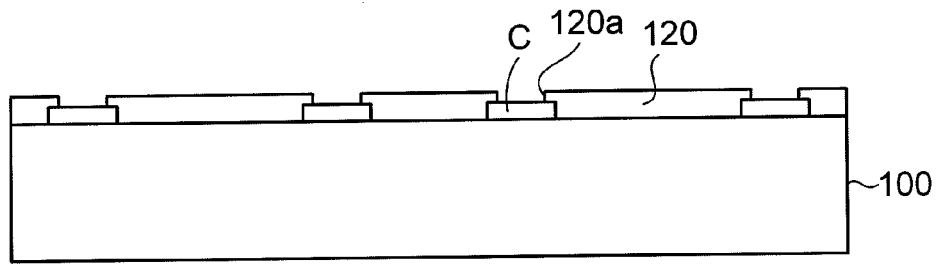
FIGS. 1A to 1D are sectional views (#1) showing a method of manufacturing an electronic component built-in substrate in the related art associated with the present invention.

As shown in FIG. 1A, first, a silicon wafer 100 having connection pads C and a passivation layer 120 in which opening portions 120a are provided thereon, on its upper surface side, is prepared. Circuit elements (not shown) such as transistors, etc. and multilayer wirings (not shown) for connecting them are formed in the silicon wafer 100, and the connection pads C are connected to the multilayer wirings.

Figure 1B:
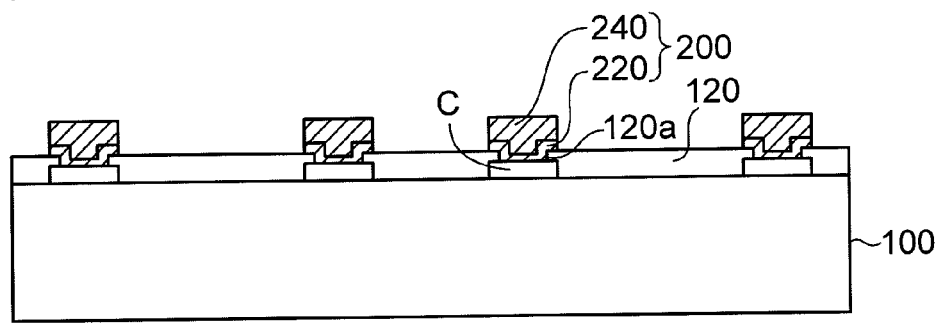

Then, as shown in FIG. 1B, a stop layer 200 acting as a stopper for the laser processing is formed on the connection pads C by the semi-additive process. The stop layer 200 is constructed by a seed layer 220 and a copper plating layer 240.

Here, a method of forming the stop layers 200 will be explained hereunder. First, a titanium (Ti) layer/a copper (Cu) layer are formed on the connection pads C and the passivation layer 120 as a seed layer in order from the bottom by the sputter method. Also, a plating resist in which an opening portion is provided on the connection pads C is formed by the photolithography.

Then, a copper plating layer is formed on the opening portions in the plating resist by the electroplating utilizing the seed layer as a plating power feeding path. Then, the plating resist is peeled off, and then the seed layer is etched by using the copper plating layer as a mask.

Accordingly, the stop layer 200 constructed by the seed layer 220 and the copper plating layer 240 is formed to be made patterns on the connection pads C.

Figure 1C:
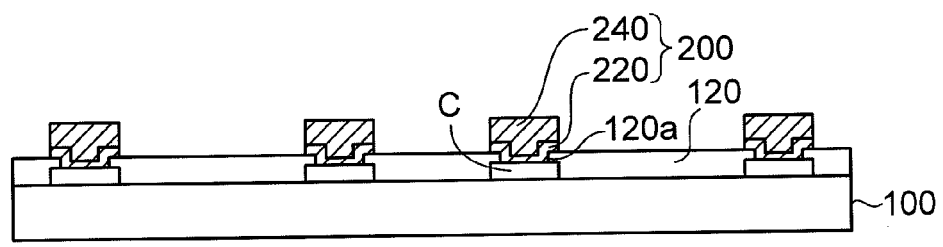

Then, as shown in FIG. 1C, a back surface of the silicon wafer 100 is ground by the grinder. Thus, the silicon wafer 100 is made thin to a desired thickness.

Figure 1D:
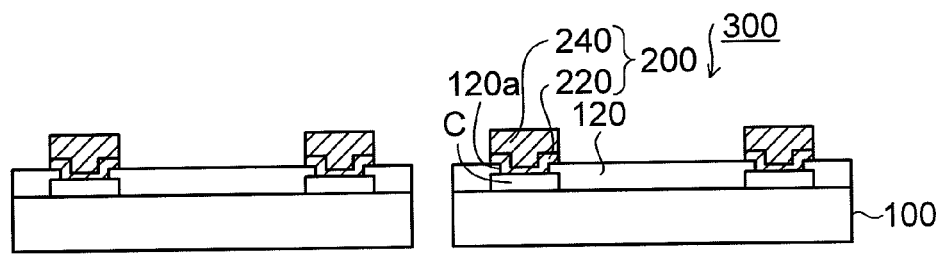

Then, as shown in FIG. 1D, the silicon wafer 100 is cut by the dicer. Thus, individual semiconductor chips 300 are obtained.

Figure 2A:
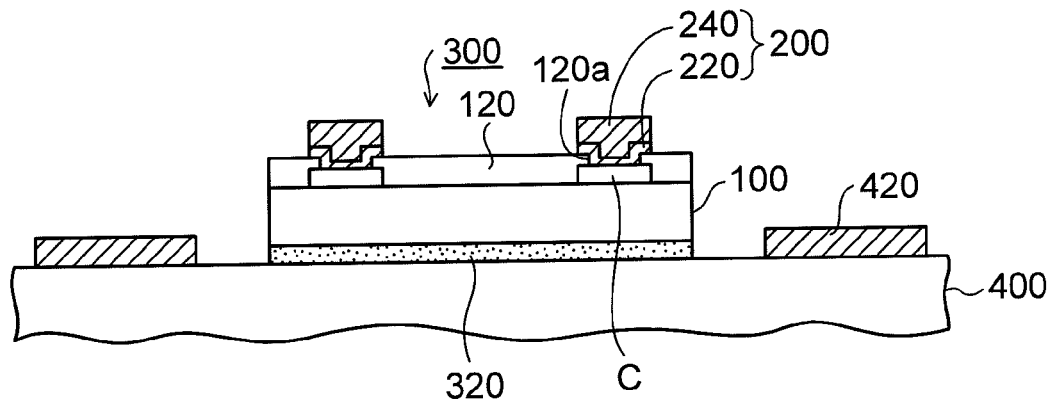
FIGS. 2A to 2C are sectional views (#2) showing the method of manufacturing the electronic component built-in substrate in the related art associated with the present invention.

Next, as shown in FIG. 2A, a wiring substrate 400 having first wiring layers 420 is prepared. The wiring substrate 400 has a multilayer structure in which a wiring layer and an insulating layer are stacked alternately on a core substrate.

Then, the semiconductor chip 300 is mounted on the wiring substrate 400. A back surface of the semiconductor chip 300 is adhered to the wiring substrate 400 via a die attach member 320 in a state that the connection pad C side is directed upward.

Figure 2B:
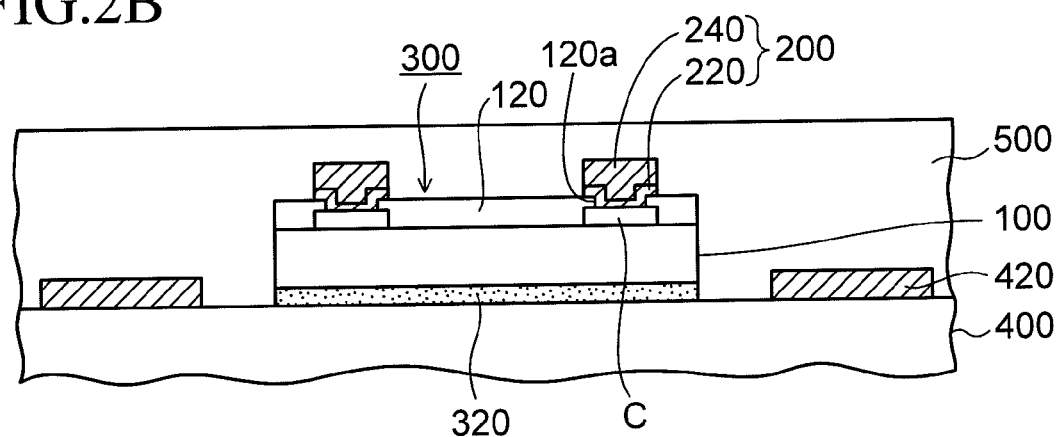
Figure 2C:
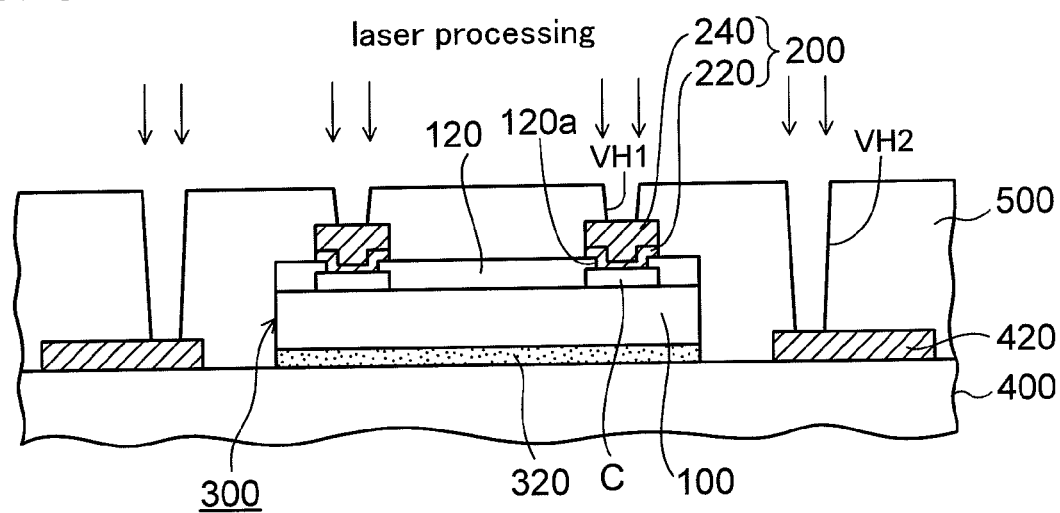

Then, as shown in FIG. 2B, an interlayer insulating layer 500 is formed by pressure-bonding a resin film to the semiconductor chip 300. Then, as shown in FIG. 2C, the interlayer insulating layer 500 is processed by the laser. Thus, first via holes VH1 whose depth reaches the stop layer 200 of the semiconductor chip 300 are formed. At this time, the laser processing is substantially stopped at the stop layer 200 of the semiconductor chip 300, and the connection pads C under that are protected from the laser.

Also, second via holes VH2 whose depth reaches the first wiring layer 420 of the wiring substrate 400 are formed in the interlayer insulating layer 500.

Figure 3A:
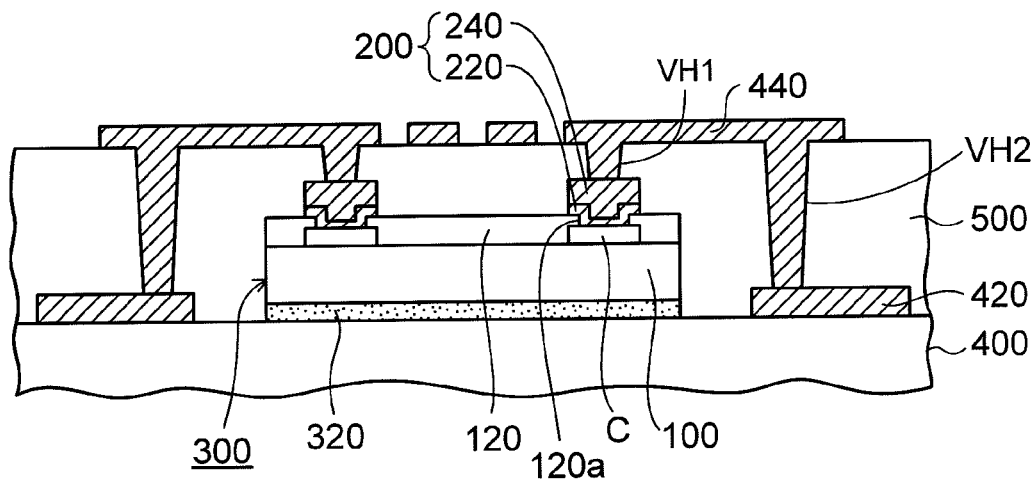
FIGS. 3A and 3B are sectional views (#3) showing the method of manufacturing the electronic component built-in substrate in the related art associated with the present invention.

Then, as shown in FIG. 3A, second wiring layers 440 connected to the stop layer 200 (connection pad C) of the semiconductor chip 300 via the first via hole VH1 (via conductor) and also connected to the first wiring layer 420 via the second via hole VH2 (via conductor) are formed. That is, the stop layer 200 (connection pad C) of the semiconductor chip 300 is connected to the first wiring layer 420 of the wiring substrate 400 via the second wiring layer 440.

Figure 3B:
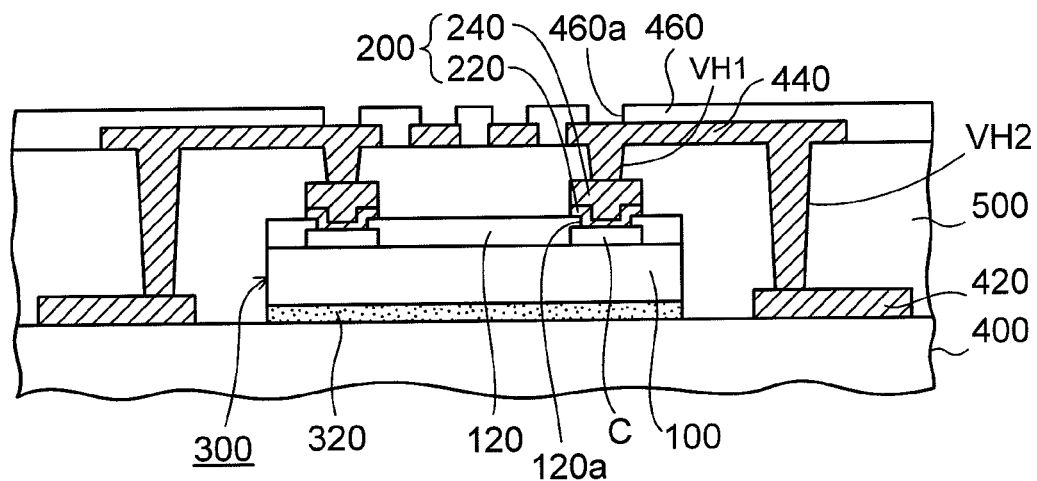

Then, as shown in FIG. 3B, a solder resist 460 in which opening portions 460a are provided on connection portions of the second wiring layers 440 is formed. With the above, the electronic component built-in substrate in the related art is obtained.

As described above, in the method of manufacturing the electronic component built-in substrate in the related art, the via holes VH1 are formed in the interlayer insulating layer 500 on the semiconductor chip 300 by the laser. Therefore, to form the stop layers 200 acting as the stopper in the laser processing on the connection pads C of the semiconductor chip 300 is necessary. This is because, when the stop layers 200 are not formed in the semiconductor chip 300, the connection pads C (Al pads) are etched and scattered to the surrounding and furthermore a part of the connection pads C disappears to cause a damage in the circuit element.

As the foregoing explanation in FIG. 1B, to form the stop layers 200 as the pattern on the connection pads C in a state of the silicon wafer 100 is necessary. In order to form the stop layers 200, the step of forming the seed layer, the step of forming the plating resist (coating, exposure, developing), the step of the electroplating of the copper, the step of peeling of the plating resist, and step of etching the seed layer are needed. Therefore, various manufacturing equipments for the wafer processes corresponding to the silicon wafer must be introduced on the mounting line. As a result, there exists such a problem that an increase of manufacturing cost is caused.

Also, even when the stop layers 200 are provided in the semiconductor chip 300, a thermal damage caused by the laser processing cannot be disregarded in the semiconductor chip 300 which is weak against a heat particularly. Therefore, it is possible that reliability of the semiconductor chip 300 is lowered.

Also, the connection pads C of the semiconductor chip 300 are connected to the second wiring layers 440 via the stop layers 200 and the via conductors raised upward in the first via holes VH1. Therefore, such a situation is considered that a contact resistance between the semiconductor chip 300 and the second wiring layer 440 is increased or a wiring length is prolonged, thereby the electric characteristics becomes disadvantageous.

Respective methods of manufacturing an electronic component built-in substrate of the present invention explained hereinafter can solve the above problems described above.

First Embodiment

Figure 11:
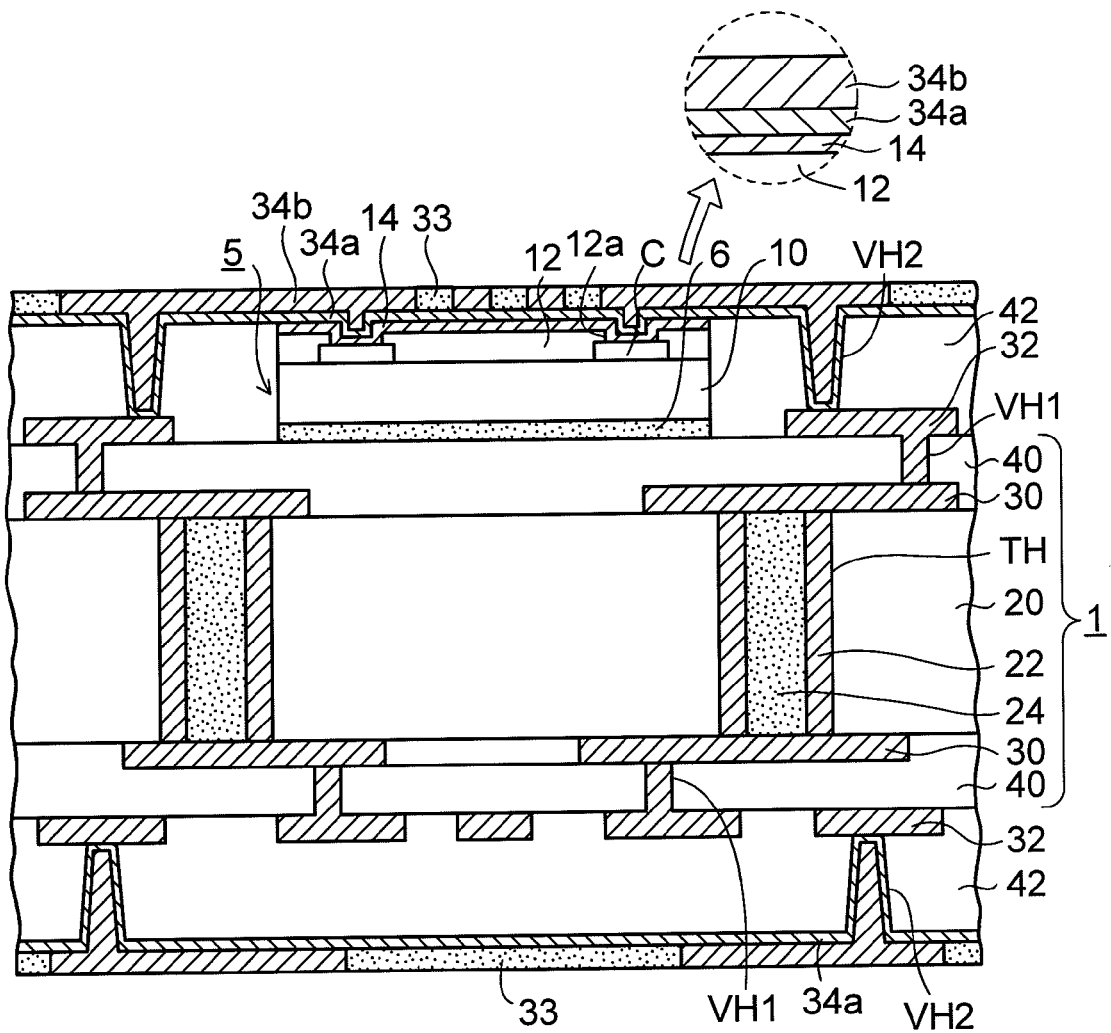
FIG. 11 is a sectional view (#8) showing the method of manufacturing the electronic component built-in substrate according to the first embodiment of the present invention.
Figure 12:
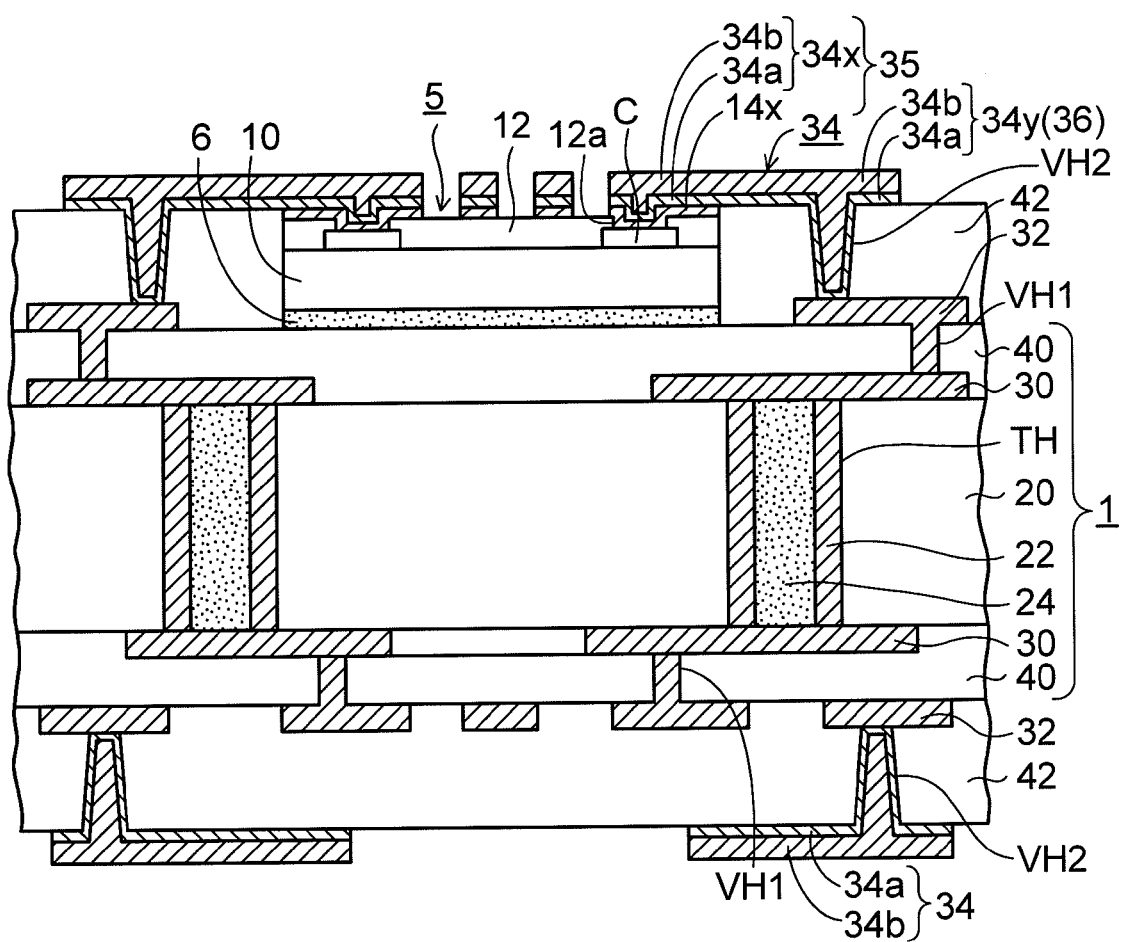
FIG. 12 is a sectional view (#9) showing the method of manufacturing the electronic component built-in substrate according to the first embodiment of the present invention.
Figure 13:
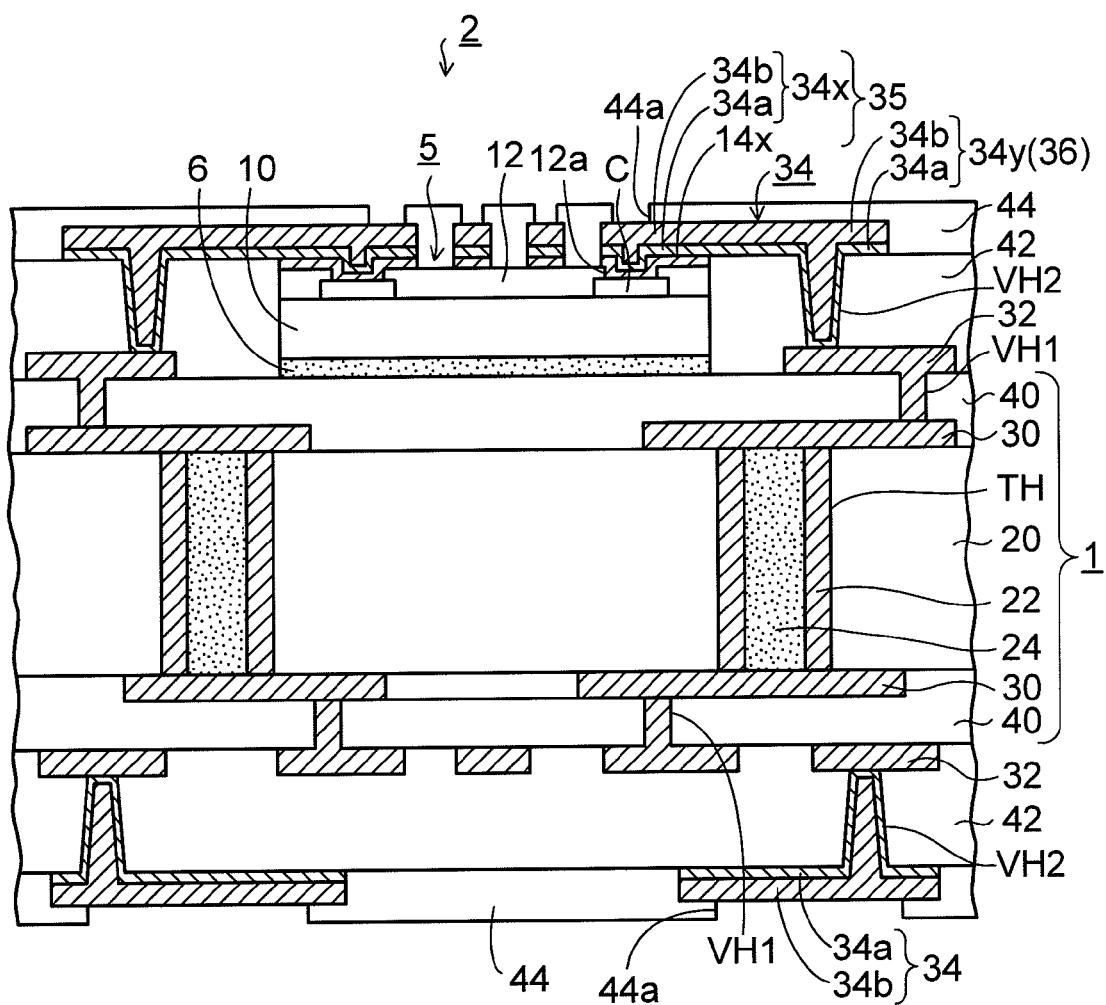
FIG. 13 is a sectional view showing an electronic component built-in substrate according to the first embodiment of the present invention.

FIG. 4A to FIG. 12 are sectional views showing a method of manufacturing an electronic component built-in substrate according to a first embodiment of the present invention, and FIG. 13 is a sectional view showing the same electronic component built-in substrate.

Figure 4A:
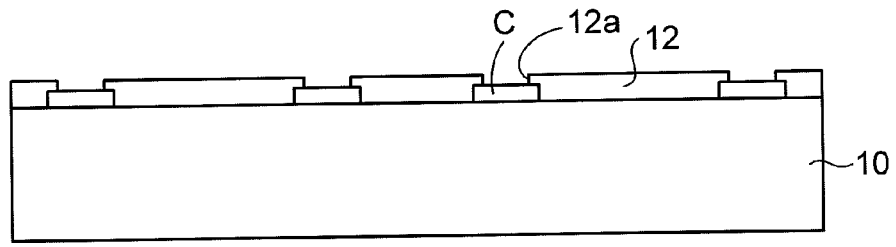
FIGS. 4A to 4D are sectional views (#1) showing a method of manufacturing an electronic component built-in substrate according to a first embodiment of the present invention.

In the method of manufacturing the electronic component built-in substrate according to the first embodiment of the present invention, as shown in FIG. 4A, a silicon wafer 10 having connection pads C and a passivation layer 12 (protection insulating layer) in which opening portions 12a are provided thereon, on its upper surface side, is prepared. In the present embodiment, the silicon wafer 10 is illustrated as a semiconductor wafer.

Circuit elements (not shown) such as transistors, etc. and multilayer wirings (not shown) for connecting them are formed in the silicon wafer 10, and the connection pads C are connected to the multilayer wirings. A thickness of the silicon wafer 10 is set to 725 μm, for example.

Figure 4B:
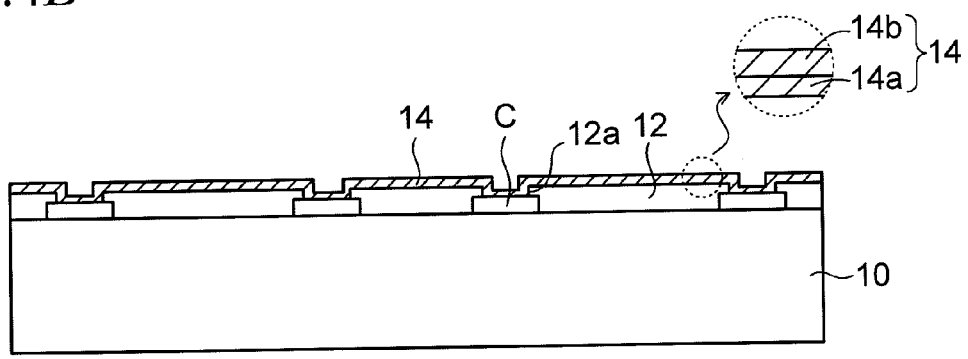

Then, as shown in FIG. 4B, a metal protection layer 14 is formed on the connection pads C and the passivation layer 12 by the sputter method. That is, the metal protection layer 14 is formed over the whole of one surface of the silicon wafer 10.

In an example in FIG. 4B, the metal protection layer 14 is formed of a stacked film, and is constructed by a titanium (Ti) layer 14a whose film thickness is 30 nm to 100 nm and a copper (Cu) layer 14b whose film thickness is 200 nm to 500 nm in order from the bottom. Alternatively, the metal protection layer 14 may be formed by stacking a chromium (Cr) layer and a copper (Cu) layer in order from the bottom, or a single metal layer may be employed.

As described later, the metal protection layer protects the semiconductor chip from the oxygen plasma or the desmear processing, and is utilized finally as a part of the wiring layer. Various metal materials can be employed in addition to the above metals if the metal layer can satisfy such functions.

Figure 4C:
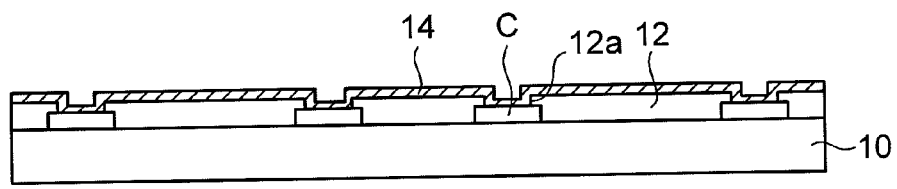

Then, as shown in FIG. 4C, the silicon wafer 10 is made thin to a desired thickness by grinding its back surface by the grinder. Also, a damaged layer caused by the grinding is removed by light-polishing the ground surface of the back surface of the silicon wafer 10. The silicon wafer 10 is ground such that the thickness thereof becomes 100 μm or less (preferably 30 μm to 50 μm).

Figure 4D:
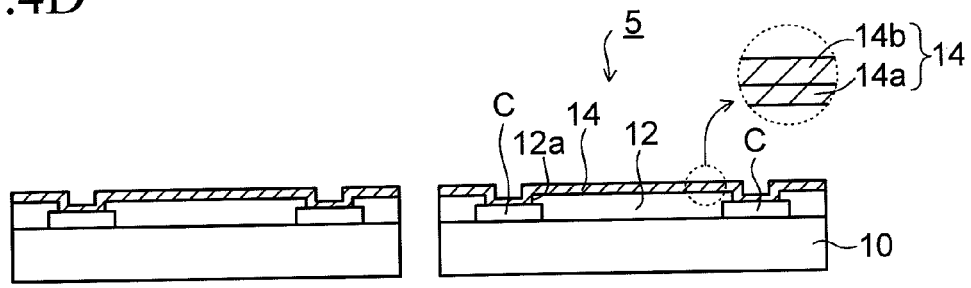

Then, as shown in FIG. 4D, individual semiconductor chips 5 (LSI chips) are obtained by cutting the silicon wafer 10 by the dicer. A large number of chip areas are defined on the silicon wafer 10, and the semiconductor chip 5 is obtained from the chip areas respectively.

As described later, in the present embodiment, the metal protection layer 14 is patterned after the semiconductor chip 5 is mounted on the wiring substrate. Therefore, the metal protection layer 14 is left still on the whole of the upper surface thereof in a state of the semiconductor chip 5.

In the present embodiment, the metal protection layer 14 is formed merely without the patterning in a state of the silicon wafer 10. Therefore, only the film forming equipment (the sputtering equipment or the depositing equipment) may be introduced in the mounting line as the wafer processing equipment. As a result, the equipment investment can be suppressed in contrast to the related art, and a lower cost can be achieved.

Figure 5A:
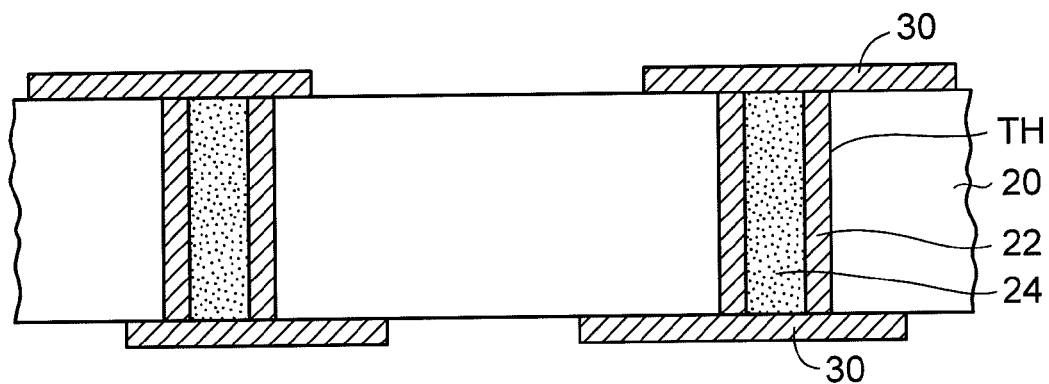
FIGS. 5A and 5B are sectional views (#2) showing the method of manufacturing the electronic component built-in substrate according to the first embodiment of the present invention.

Next, a wiring substrate on which the above semiconductor chip 5 is mounted will be explained hereunder. First, a structure shown in FIG. 5A is prepared. In FIG. 5A, through holes TH are provided in an insulating core substrate 20 such as a glass epoxy resin, and a through hole plating layer 22 is formed on inner walls of the through holes TH. A resin 24 is filled in remained holes of the through holes TH. Also, a first wiring layer 30 connected mutually via the through hole plating layer 22 is formed on both surface sides of the core substrate 20 respectively.

Alternatively, a through electrode may be filled in the through holes TH of the core substrate 20, and the first wiring layers 30 may connected mutually via the through electrodes.

Figure 5B:
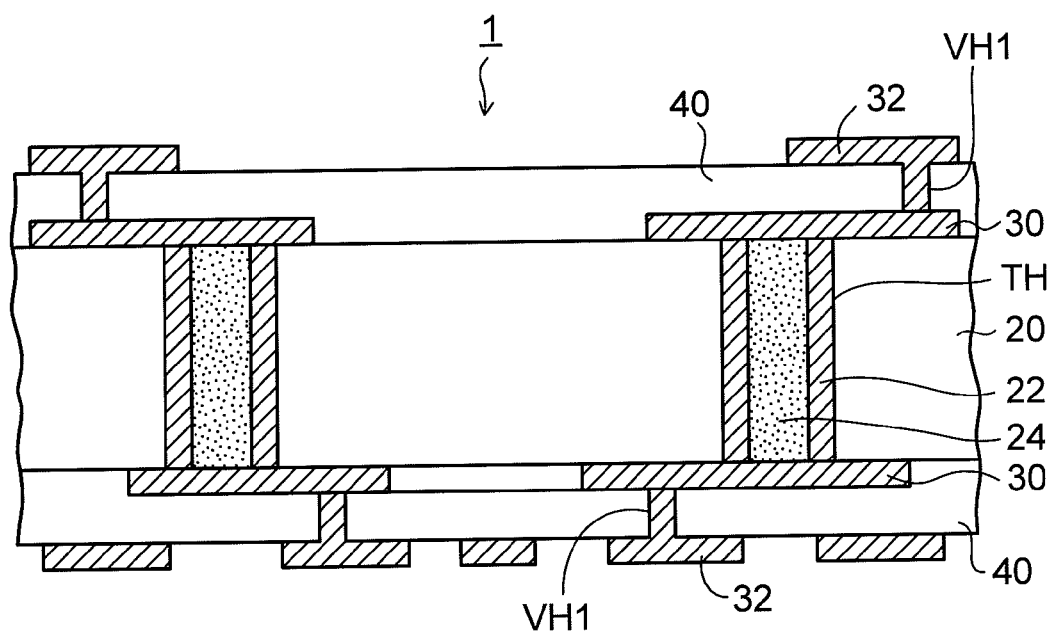

Then, as shown in FIG. 5B, a first interlayer insulating layer 40 for covering the first wiring layers 30 is formed on both surface sides of the core substrate 20 respectively. Then, the first interlayer insulating layer 40 on both surface sides of the core substrate 20 is processed by the laser, or the like. Thus, first via holes VH1 whose depth reaching the first wiring layer 30 are formed respectively.

Then, a second wiring layer 32 connected to the first wiring layers 30 via the first via holes VH1 (via conductor) is formed on the first interlayer insulating layer 40 on both surface sides of the core substrate 20 respectively.

In the present embodiment, the structure in FIG. 5B is used as a wiring substrate 1 on which the above semiconductor chip 5 is mounted.

Figure 6A:
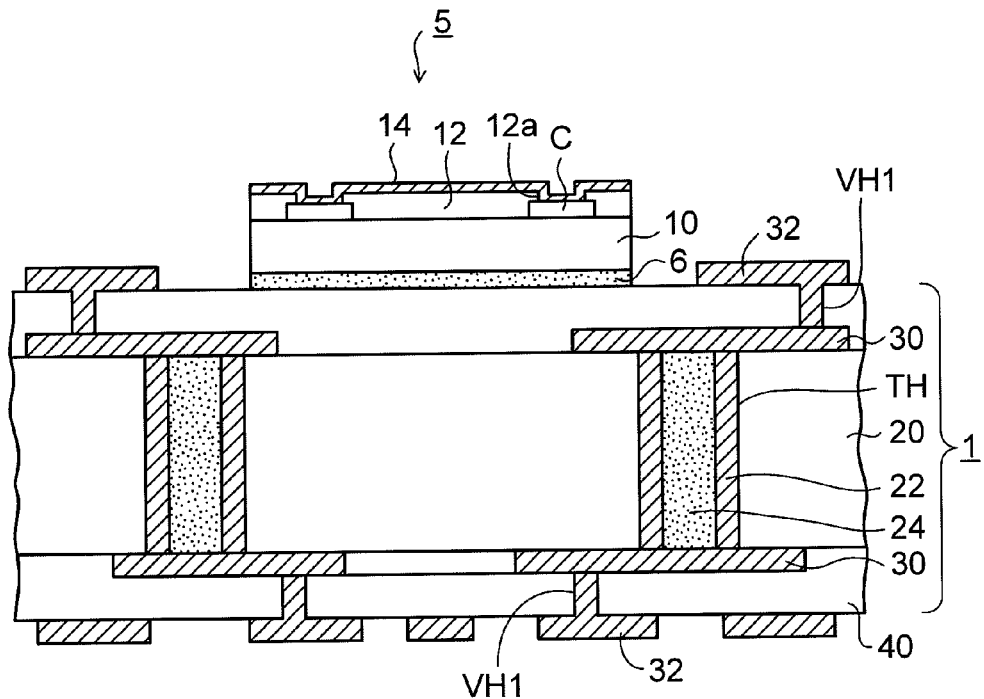
FIGS. 6A and 6B are sectional views (#3) showing the method of manufacturing the electronic component built-in substrate according to the first embodiment of the present invention.

Then, as shown in FIG. 6A, the above semiconductor chip 5 is prepared. Then, the semiconductor chip 5 is mounted by adhering a back surface of the semiconductor chip 5 onto the first interlayer insulating layer 40 of the wiring substrate 1 via a die attach member 6 to direct a surface (element forming surface) on which the connection pads C of the semiconductor chip 5 are provided upward.

Figure 6B:
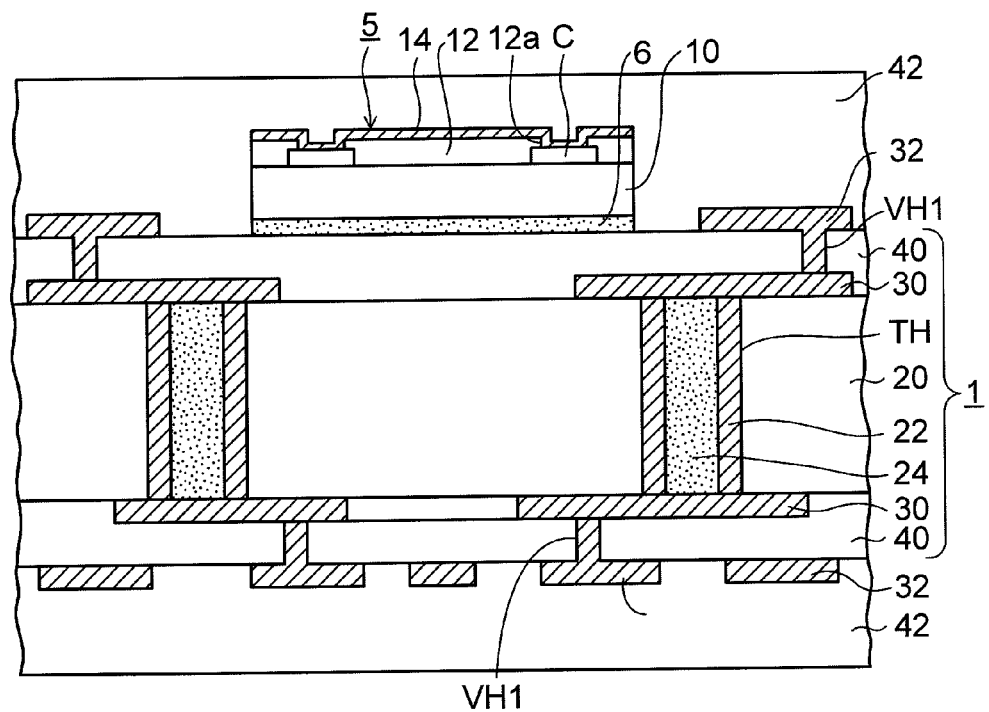

Then, as shown in FIG. 6B, an uncured resin film is pressured-bonded onto the wiring substrate 1 and the semiconductor chip 5. Then, a second interlayer insulating layer 42 is formed by curing the resin film in a temperature atmosphere of about 200° C. by the heat treatment. Accordingly, the whole of the semiconductor chip 5 is embedded in the second interlayer insulating layer 42. Similarly, the second interlayer insulating layer 42 for covering the second wiring layer 32 is formed on the lower surface side of the core substrate 20. As the material of the second interlayer insulating layer 42, a thermosetting resin such as an epoxy resin, a polyimide resin, or the like is employed.

Figure 7:
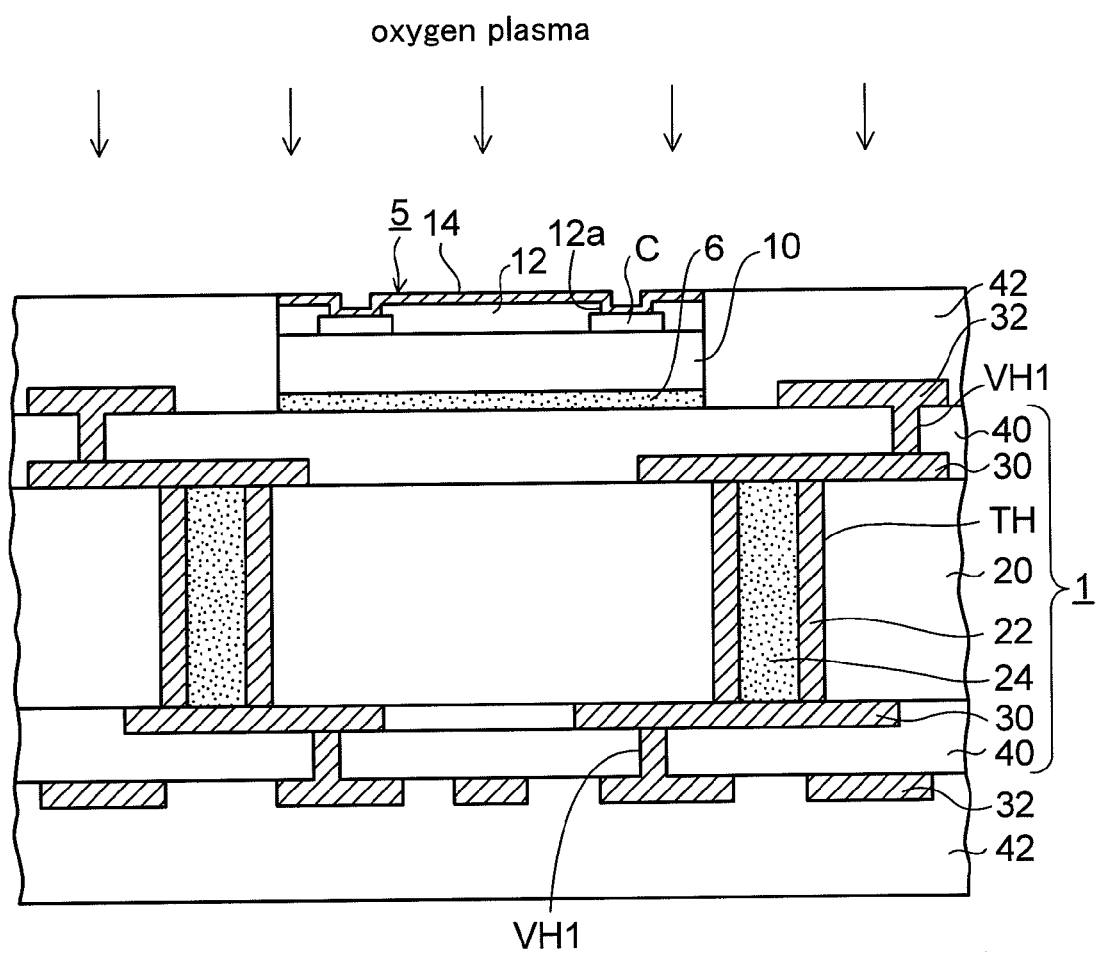
FIG. 7 is a sectional view (#4) showing the method of manufacturing the electronic component built-in substrate according to the first embodiment of the present invention.

Then, as shown in FIG. 7, the second interlayer insulating layer 42 (resin) on the upper surface side of the core substrate 20 is etched by the oxygen plasma until the metal protection layer 14 of the semiconductor chip 5 is exposed. Organic components of the second interlayer insulating layer 42 (resin) react with oxygen ions and oxygen radicals, and the second interlayer insulating layer 42 is etched.

As the plasma source of the oxygen plasma, the anisotropic dry etching equipment (the RIE equipment, or the like) may be employed, or the isotropic ashing equipment used in the dry ashing may be employed. The oxygen plasma is the plasma using an oxygen gas as a major gas, and a gas containing halogen atoms such as $CF_4$, or the like, an inert gas, or the like may be added to the oxygen gas.

Accordingly, a thickness of the second interlayer insulating layer 42 becomes substantially equal to a height of the semiconductor chip 5, and such a state is obtained that an upper surface (metal protection layer 14) of the semiconductor chip 5 is exposed. As described later, fan-out wirings are formed to extend from the semiconductor chip 5 onto the second interlayer insulating layer 42. Therefore, it is preferable that upper surfaces of the second interlayer insulating layer 42 and the semiconductor chip 5 become the same height and are planarized, but the second interlayer insulating layer 42 may be etched to sink in slightly from the semiconductor chip 5 to such extent that the fan-out wirings are not disconnected.

At this time, since the metal protection layer 14 is formed on the whole of the upper surface of the semiconductor chip 5, even when the passivation layer 12 located under the metal protection layer 14 is formed of polyimide which is easily etched by the oxygen plasma, the passivation layer 12 is protected from the oxygen plasma and is never damaged. Also, since the connection pads C are also protected from the oxygen plasma by the metal protection layer 14, the connection pads C and the underlying circuit elements are never damaged.

In this case, the second interlayer insulating layer 42 may be polished by the CMP (Chemical Mechanical Polishing) instead of the oxygen plasma until the metal protection layer 14 of the semiconductor chip 5 is exposed. When a resin residue is left at the stepped portions of the opening portion 12 of the passivation layer 12 of the semiconductor chip 5, the majority of the second interlayer insulating layer 42 in thickness may be polished by the CMP and then the resin residue may be removed by the isotropic oxygen plasma.

Figure 8:
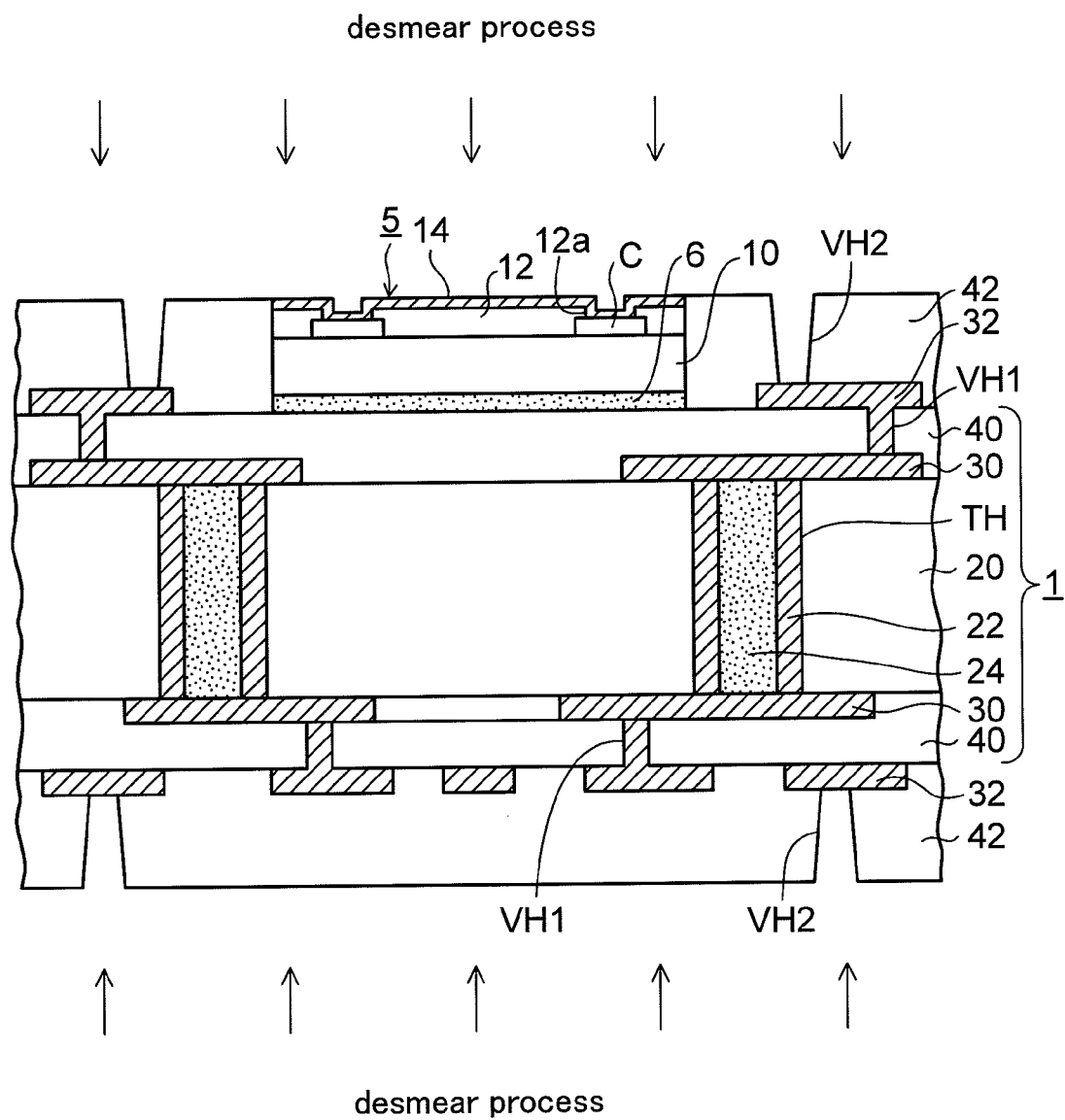
FIG. 8 is a sectional view (#5) showing the method of manufacturing the electronic component built-in substrate according to the first embodiment of the present invention.

Then, as shown in FIG. 8, second via holes VH2 whose depth reaches the second wiring layer 32 are formed by processing the second interlayer insulating layer 42 on the upper surface side of the core substrate 20 by the laser, or the like. Also, the second via holes VH2 whose depth reaches the second wiring layer 32 are formed similarly in the second interlayer insulating layer 42 on the lower surface side of the core substrate 20.

Then, the desmear process is applied to the inside of the second via holes VH2 on both surface sides of the core substrate 20. Thus, the resin smear left in the second via holes VH2 is removed and cleaned. As the desmear process, for example, the potassium permanganate method is employed. The upper surface of the semiconductor chip 5 is exposed in applying the desmear process, but the inside of the semiconductor chip 5 is protected from a desmear liquid by the metal protection layer 14. Therefore, there is no fears that the semiconductor chip 5 is damaged by the desmear process.

Figure 9:
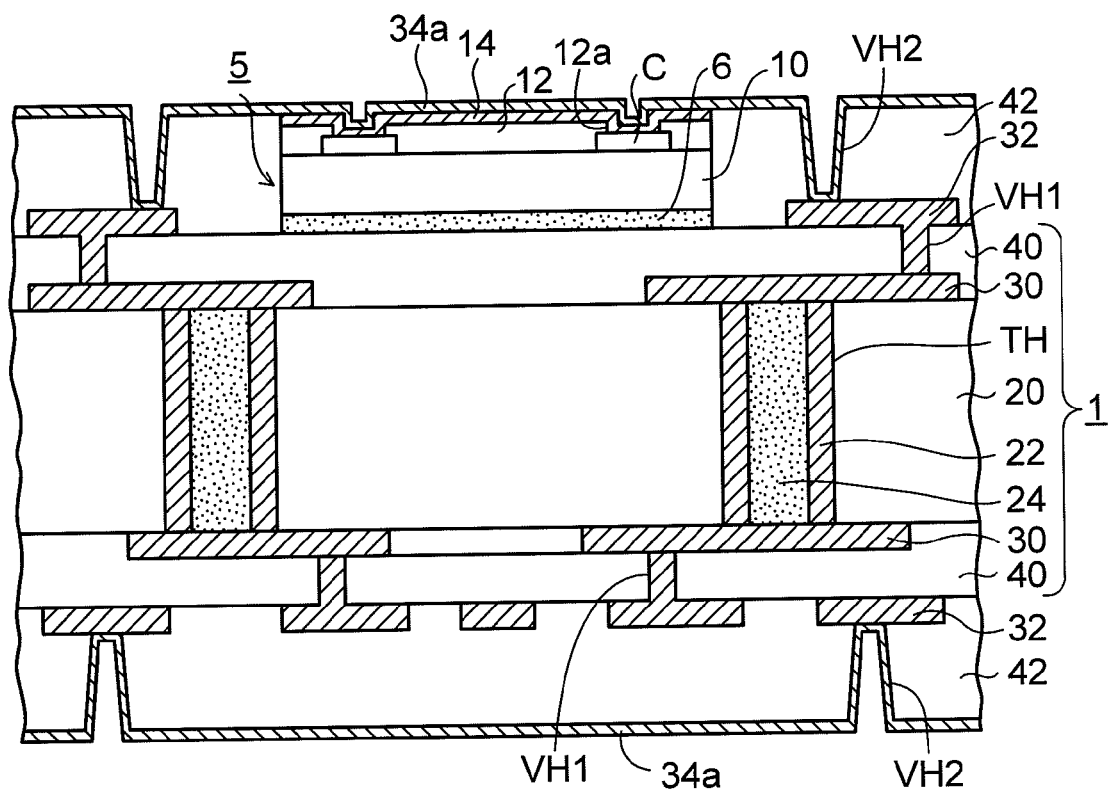
FIG. 9 is a sectional view (#6) showing the method of manufacturing the electronic component built-in substrate according to the first embodiment of the present invention.

Then, as shown in FIG. 9, a copper layer, or the like is formed on the second interlayer insulating layer 42 and on the inner surfaces of the second via holes VH2 by the electroless plating in the upper surface side of the core substrate 20, thus a seed layer 34a is obtained The seed layer 34a is formed similarly on the second interlayer insulating layer 42 and on the inner surfaces of the second via holes VH2 in the lower surface side of the core substrate 20.

Figure 10:
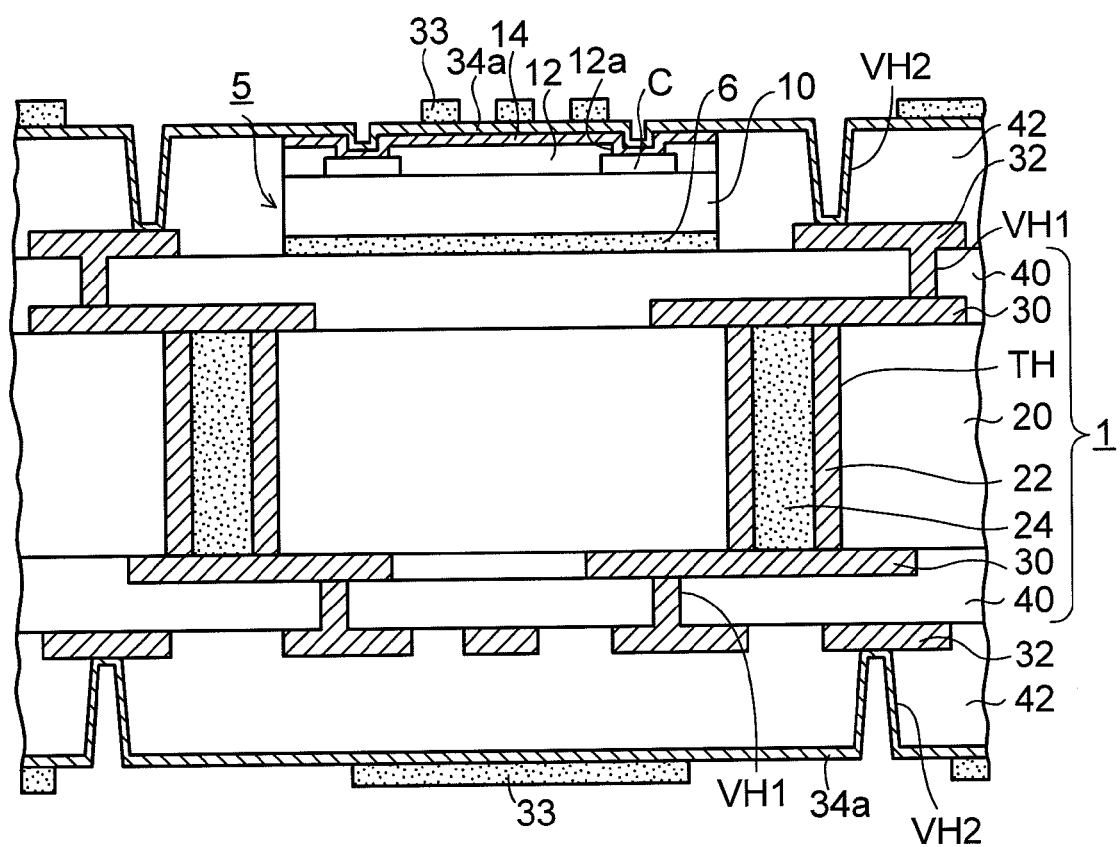
FIG. 10 is a sectional view (#7) showing the method of manufacturing the electronic component built-in substrate according to the first embodiment of the present invention.

Then, as shown in FIG. 10, in both surface sides of the core substrate 20, a plating resist 33 in which opening portions are provided on portions where a third wiring layer is formed is formed on the seed layer 34a by the photolithography.

Then, as shown in FIG. 11, in both surface sides of the core substrate 20, a metal plating layer 34b made of copper, or the like is formed in the opening portions of the plating resist 33 and the second via holes VH2 by the electroplating utilizing the seed layer 34a as a plating power feeding path. In the second via holes VH2, the plating is applied inwardly from the seed layer 34a of the inner wall, and thus a metal plating layer is filled in the second via holes VH2 and via conductors are obtained.

Then, as shown in FIG. 12, the plating resist 33 is removed. Then, the seed layer 34a is etched by using the metal plating layer 34b as a mask. At this time, on the semiconductor chip 5, the seed layer 34a is etched and subsequently the metal protection layer 14 is etched. The seed layer 34a (copper layer) and the copper layer 14b of the metal protection layer 14 (FIG. 4D) are etched by a mixed solution of a sulfuric acid and a hydrogen peroxide solution, and also the underlying titanium layer 14a (FIG. 4D) of the metal protection layer 14 is etched by a mixed solution of a hydrogen peroxide solution and a phosphoric acid or an aqueous ammonia.

Accordingly, on the semiconductor chip 5, an in-chip wiring part 35 is formed by an underlying metal pattern layer 14x which is formed by patterning the metal protection layer 14, and a conductive pattern layer 34x which is constructed by the seed layer 34a formed thereon and the metal plating layer 34b.

In contrast, on the second interlayer insulating layer 42, an extended wiring part 36 formed of a conductive pattern layer 34y which constructed by the seed layer 34a and the metal plating layer 34b is formed. The extended wiring part 36 is connected to the in-chip wiring part 35, and is formed to extend from the semiconductor chip 5 onto the second interlayer insulating layer 42 on the outside. A third wiring layer 34 (upper wiring layer) is constructed by the in-chip wiring part 35 and the extended wiring part 36.

The in-chip wiring part 35 is connected to the connection pads C of the semiconductor chip 5, and the extended wiring part 36 is connected to the second wiring layer 32 of the wiring substrate 1 via the second via holes VH2. That is, the connection pads C of the semiconductor chip 5 are connected electrically to the second wiring layer 32 of the wiring substrate 1 via the third wiring layer 34.

Here, in the present embodiment, the third wiring layer 34 (the in-chip wiring part 35 and the extended wiring part 36) is formed on the semiconductor chip 5 and the second interlayer insulating layer 42 by the semi-additive process. In this case, the third wiring layer 34 may be formed by the subtractive process.

In this case, although not particularly shown, first, a conductive layer such as copper, or the like is formed like a blanket on the semiconductor chip 5 and the second interlayer insulating layer 42 and in the second via holes VH2 by the plating method or the sputter method. Then, the resist is patterned on the conductive layer, and then the conductive layer and the metal protection layer 14 are etched by using the resist as a mask.

When the third wiring layer 34 is formed by the subtractive process, the conductive pattern layers 34x, 34y of the third wiring layer 34 can also be formed with the different layer constitution from that (the seed layer 34a and the metal plating layer 34b) in FIG. 12.

Also, the seed layer 34a is etched on the lower surface side of the core substrate 20 by using the metal plating layer 34b as a mask. Accordingly, the third wiring layer 34 connected to the second wiring layer 32 via the second via holes VH2 is formed on the second interlayer insulating layer 42 on the lower surface side of the core substrate 20.

Then, as shown in FIG. 13, a solder resist 44 in which opening portions 44a are provided on the connection portions of the third wiring layer 34 is formed on both surface sides of the core substrate 20 respectively. Also, contact portions (not shown) are provided on the connection portions of the third wiring layer 34 on both surface sides of the core substrate 20 by forming nickel/gold plating layers, or the like in order from the bottom respectively.

With the above, the electronic component built-in substrate 2 of the present embodiment is obtained. When a large-size substrate for multi production is employed as the wiring substrate 1, the semiconductor chip 5 is mounted in a large number of chip mounting areas which are defined in the wiring substrate 1 respectively, and then the wiring substrate 1 is cut such that individual electronic component built-in substrates 2 can be obtained.

As explained above, in the method of manufacturing the electronic component built-in substrate of the present embodiment, the metal protection layer 14 is provided on the whole of the upper surface of the semiconductor chip 5. Therefore, the second interlayer insulating layer 42 in which the semiconductor chip 5 is embedded can be etched by the oxygen plasma without giving any damage to the semiconductor chip 5 to expose the upper surface of the semiconductor chip 5.

Accordingly, the third wiring layers 34 (fan-out wirings) extended from the upper surface of the semiconductor chip 5 onto the second interlayer insulating layer 42 on the outside can be formed easily. At this time, the metal protection layer 14 of the semiconductor chip 5 is utilized as a part of the third wiring layers 34.

Therefore, unlike the related art, there is on necessity that the via holes should be formed in the interlayer insulating layer on the semiconductor chip 5 by the laser and then the upper wiring layer raised upward from the via holes should be formed.

As a result, since the wiring structure can be made simple rather than the related art, a manufacturing cost can be reduced. In addition, since a wiring length can be made short in contrast to the related art, the electric characteristics of the wiring substrate can be improved.

Further, no laser via is formed on the semiconductor chip 5. Therefore, even when the semiconductor chip which is weak against a heat is employed, the semiconductor chip never receives thermal damage, and reliability can be improved.

Also, in the case that the second interlayer insulating layer 42 is etched by the oxygen plasma to expose the semiconductor chip 5, there is no need to introduce the polishing equipment. Therefore, the manufacturing equipments on the existing mounting line can respond to the present invention, a reduction in cost can be attained.

As shown in FIG. 13, in the electronic component built-in substrate 2 of the present embodiment, the semiconductor chip 5 having the connection pads C and the passivation layer 12 (protection insulating layer) in which the opening portions 12a are provided thereon is mounted on the above wiring substrate 1. The back surface of the semiconductor chip 5 is adhered to the first interlayer insulating layer 40 of the wiring substrate 1 via the die attach member 6 in a state that its connection pads C side (element forming surface) is directed upward.

The second interlayer insulating layer 42 whose thickness is substantially equal to this semiconductor chip 5 is formed on the side of the semiconductor chip 5, and the semiconductor chip 5 is embedded in the second interlayer insulating layer 42 up to an upper portion of the side surface.

Figure 14:
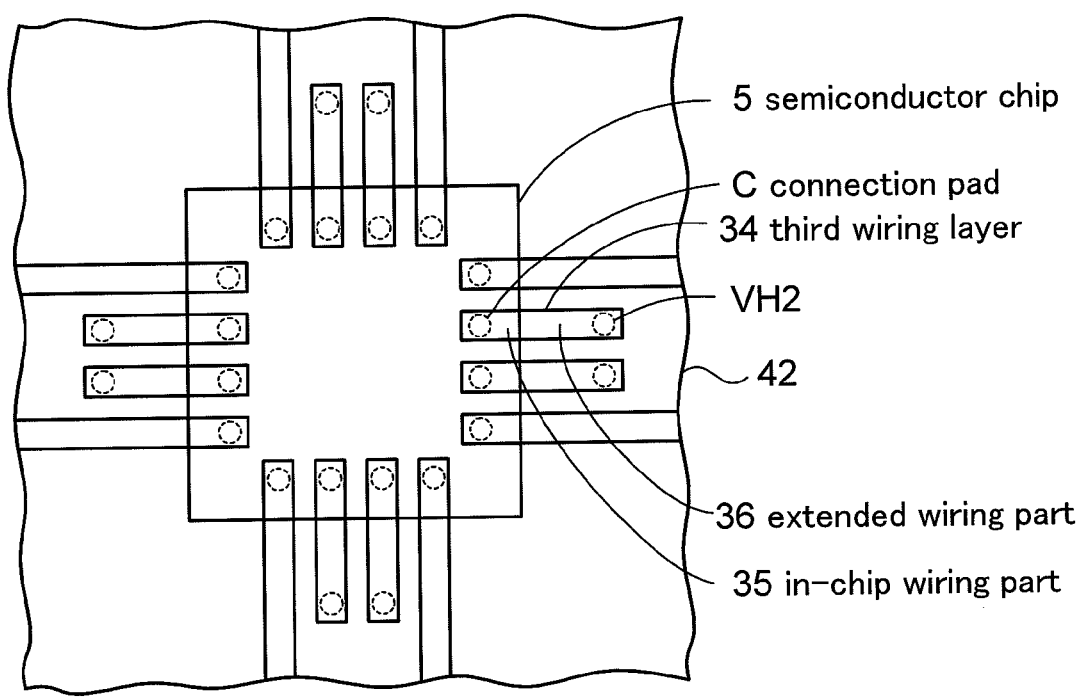
FIG. 14 is a plan view showing a state of third wiring layers of the electronic component built-in substrate according to the first embodiment of the present invention, when viewed from the top.

FIG. 14 is a fragmentary plan view showing a state of the arrangement of the third wiring layers 34 in FIG. 13, when viewed from the top. In FIG. 14, the solder resist 44 in FIG. 13 is omitted.

By reference to FIG. 13 as well as the fragmentary plan view in FIG. 14, the connection pads C of the semiconductor chip 5 are arranged on the peripheral portion side by side with the peripheral type. Then, a plurality of third wiring layers 34 (upper wiring layers) connected to the connection pads C are formed to extend from four sides of the semiconductor chip 5 to the outside respectively. Each of the third wiring layers 34 is constructed by the in-chip wiring part 35 formed on the semiconductor chip 5 and the extended wiring part 36 connected to this in-chip wiring part 35 and extended onto the second interlayer insulating layer 42.

As described above, in an example in FIG. 13, the in-chip wiring parts 35 of the third wiring layers 34 are formed on the semiconductor chip 5, on the upper surface of which the metal protection layer 14 is provided, on the basis of the semi-additive process. Therefore, the in-chip wiring part 35 on the semiconductor chip 5 is constructed by the underlying metal pattern layer 14x formed by patterning the metal protection layer 14, and the conductive pattern layer 34x formed of the seed layer 34a and the metal plating layer 34b. Then, the in-chip wiring parts 35 are formed in a state that the lower surfaces thereof contact the upper surface (passivation layer 12) of the semiconductor chip 5.

Meanwhile, the extended wiring part 36 on the second interlayer insulating layer 42 does not have the underlying metal pattern layer 14x, and is formed only of the conductive pattern layer 34y constructed by the seed layer 34a and the metal plating layer 34b in order from the bottom. The conductive pattern layer 34y of the extended wiring part 36 is formed by the identical layer as the conductive pattern layer 34x of the in-chip wiring part 35.

Also, the second via holes VH2 reaching the second wiring layer 32 of the wiring substrate 1 are provided in the second interlayer insulating layer 42. The extended wiring parts 36 of the third wiring layers 34 are connected to the second wiring layers 32 via the second via holes VH2. Accordingly, the connection pads C of the semiconductor chip 5 are connected electrically to the second wiring layers 32 of the wiring substrate 1 by the third wiring layers 34.

In this manner, in the electronic component built-in substrate 2 of the present embodiment, the metal protection layer 14 of the semiconductor chip 5 is patterned and is utilized finally as a part of the wirings. Therefore, the third wiring layers 34 have the different layer constitution on the semiconductor chip 5 and the second interlayer insulating layer 42.

In this case, as described above, when the third wiring layers 34 are formed by the subtractive process, or the like, the conductive pattern layers 34x, 34y can be formed in various layer constitution (single layer film or stacked film).

Also, in FIG. 14, the connection pads C of the semiconductor chip 5 may be arranged with the area array type from the peripheral portion to the center portion. In this case, similarly the third wiring layers 34 are formed to extend outward from the semiconductor chip 5.

Also, in FIG. 14, the wiring layers not directly connected to the connection pads C can be arranged to cross over the semiconductor chip 5.

Also, by reference to FIG. 13, the second interlayer insulating layer 42 in which the second via holes VH2 are provided on the second wiring layers 32 is formed also on the lower surface side of the wiring substrate 1. Also, the third wiring layers 34 connected to the second wiring layers 32 via the second via holes VH2 (via conductors) are formed on the second interlayer insulating layer 42.

Also, on both surface sides of the core substrate 20, the solder resist 44 in which the opening portions 44a are provided on the connection portions of the third wiring layers 34 respectively. Also, the contact layers (not shown) such as Ni/Au plating layers, or the like are formed on the connection portions of the third wiring layers 34.

Then, in FIG. 13, the upper semiconductor chip is flip-chip mounted on the connection portions of the third wiring layers 34 on the upper surface side of the core substrate 20, and the external connection terminals such as the solder balls, or the like are provided on the connection portions of the third wiring layers 34 on the lower surface side.

In the present embodiment, the semiconductor chip 5 is illustrated as the electronic component. In this event, the passive component such as a capacitor chip having the connection pads in one surface, or the like can be built in similarly. The semiconductor chip 5 and the passive component may be built in mixedly or only the passive component may be built in.

Second Embodiment

Figure 16A:
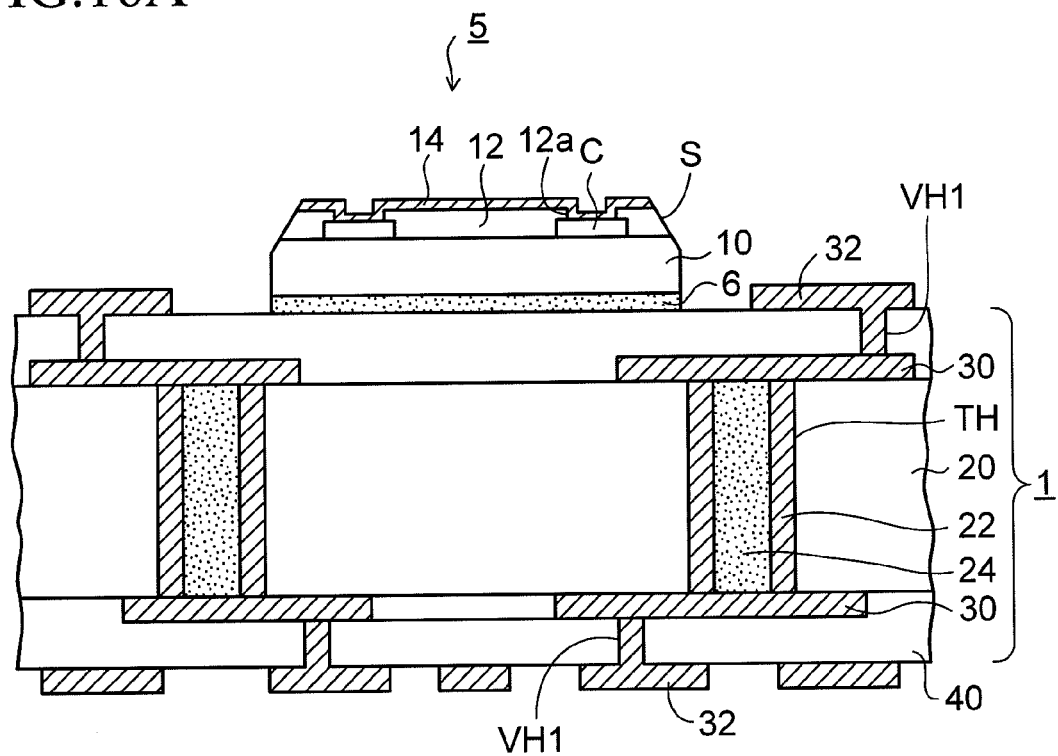
FIGS. 16A and 16B are sectional views (#2) showing the method of manufacturing the electronic component built-in substrate according to the second embodiment of the present invention.
Figure 16B:
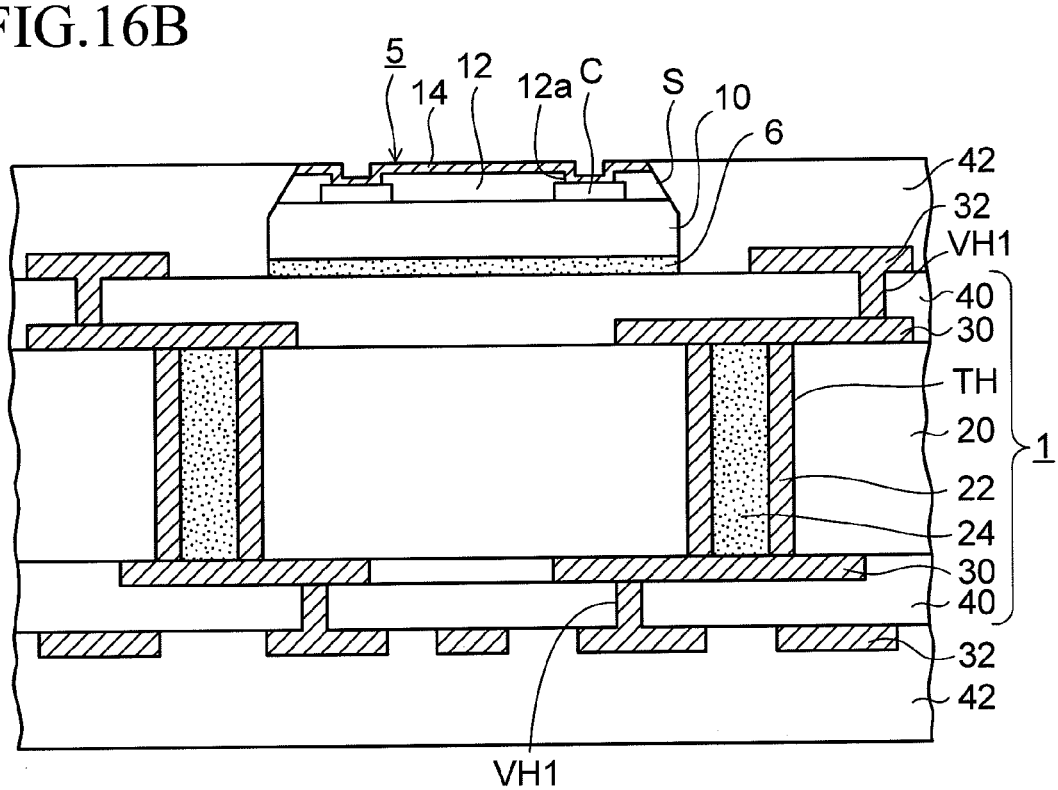
Figure 17:
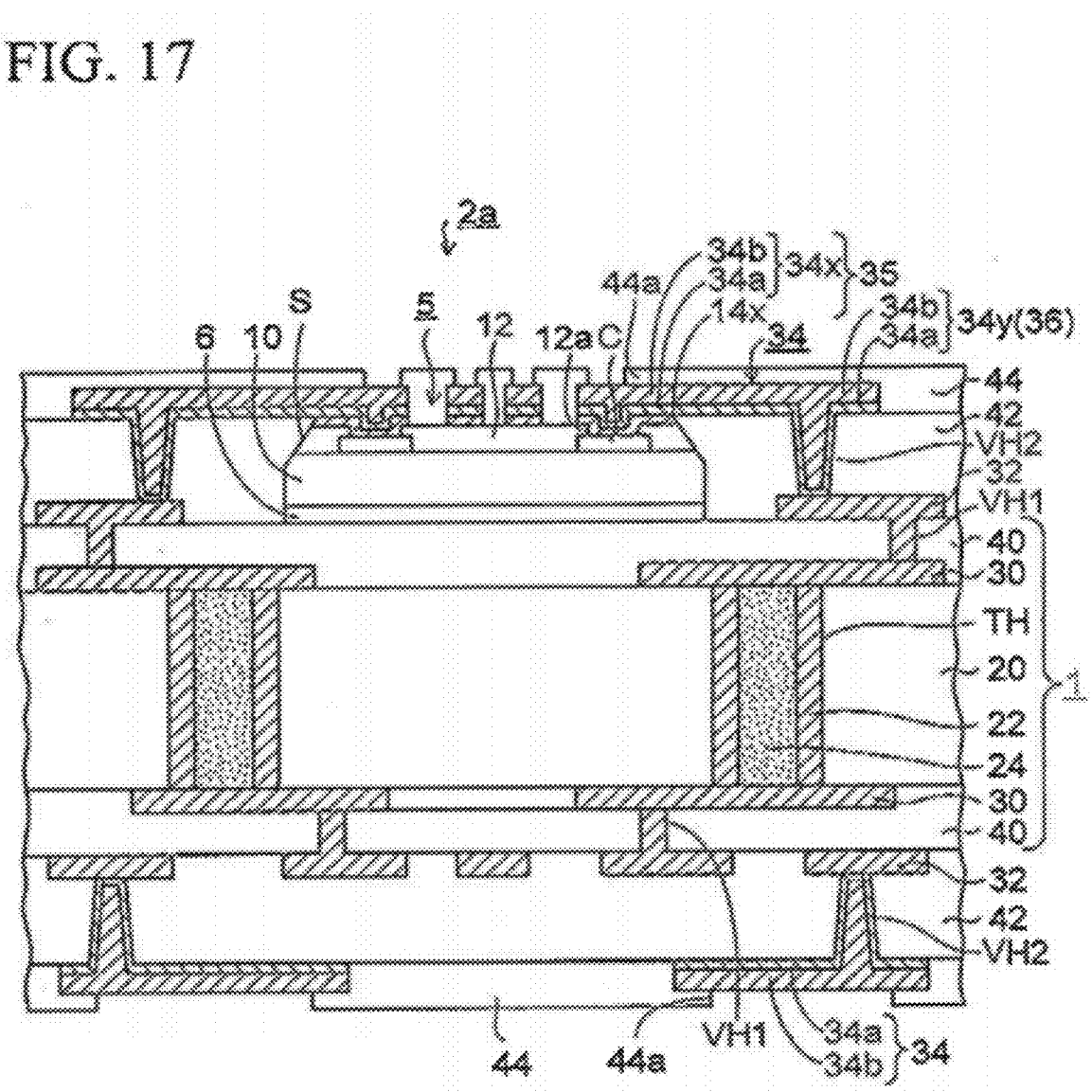
FIG. 17 is a sectional view showing an electronic component built-in substrate according to the second embodiment of the present invention.

FIG. 15 and FIG. 16 are sectional views showing a method of manufacturing an electronic component built-in substrate according to a second embodiment of the present invention, and FIG. 17 is similarly a sectional view showing the electronic component built-in substrate. A feature of the second embodiment resides in that generation of stress in mounting the semiconductor chip is relaxed by cutting upper corner portions of the semiconductor chip. In the second embodiment, explanation of the same steps as those in the first embodiment will be omitted herein, and also explanation of the same elements will be omitted herein by affixing the same reference symbols to them.

Figure 15A:
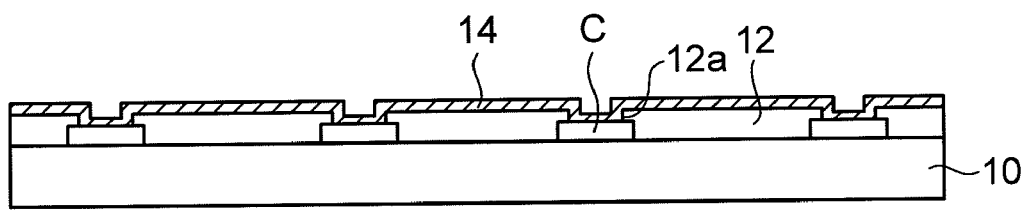
FIGS. 15A to 15C are sectional views (#1) showing a method of manufacturing an electronic component built-in substrate according to a second embodiment of the present invention.

In the second embodiment, as shown in FIG. 15A, like FIG. 4B of the first embodiment, first, the silicon wafer 10 on the whole of the upper surface of which the metal protection layer 14 is provided is prepared.

Figure 15B:
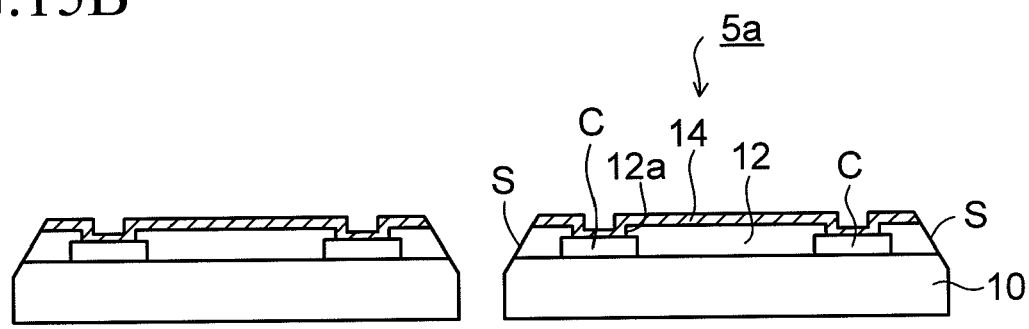

Then, as shown in FIG. 15B, the silicon wafer 10 is cut like a V-shape to the middle of thickness by the chamfering V-shaped blade, and then individual semiconductor chips 5a are obtained by cutting the remaining portion of the silicon wafer 10 by the cutting blade (bevel cut). Accordingly, the individual semiconductor chips 5a having a chamfered portion S, side surface upper portions of four sides of which are chamfered obliquely, are obtained.

Figure 15C:
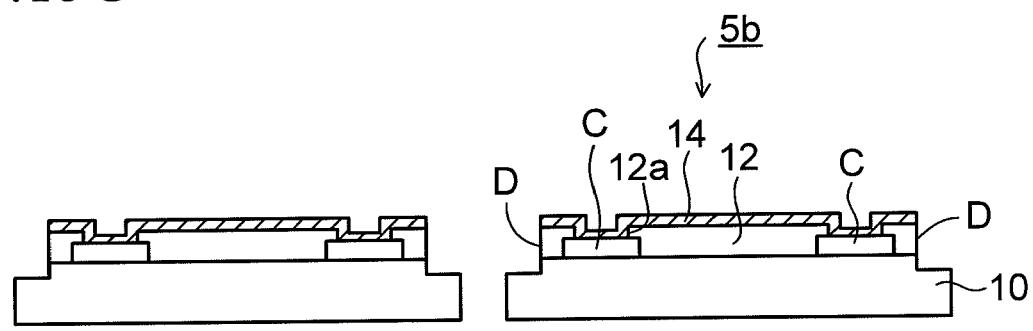

Alternatively, as shown in FIG. 15C, the silicon wafer 10 is cut with a wide range to the middle of thickness by the wide range blade, and then individual semiconductor chips 5b are obtained by cutting the remaining portion of the silicon wafer 10 by the cutting blade (step cut). Accordingly, the semiconductor chips 5b, side surfaces of four sides of which are shaped in to a stepped surface D, are obtained.

An example in which an electronic component built-in substrate is manufactured by employing the semiconductor chip 5a in FIG. 15B will be explained hereunder.

As shown in FIG. 16A, a back surface of the semiconductor chip 5a is adhered onto on the same wiring substrate as that of FIG. 5B in the above first embodiment by the die attach member 6 such that the connection pads C of the semiconductor chip 5a in FIG. 15B are directed upward.

Then, as shown in FIG. 16B, like the first embodiment, the whole of the semiconductor chip 5a is embedded in the second interlayer insulating layer 42, and then the second interlayer insulating layer 42 is etched by the oxygen plasma until the metal protection layer 14 of the semiconductor chip 5a is exposed. Accordingly, a thickness of the second interlayer insulating layer 42 becomes substantially equal to a height of the semiconductor chip 5a, and thus such a state is obtained that the upper surface (metal protection layer 14) of the semiconductor chip 5a is exposed.

At this time, the second interlayer insulating layer 42 is left also around the chamfered portion S of the semiconductor chip 5a. By shaping the side surface upper portion of the semiconductor chip 5a into the chamfered portion S, when the semiconductor chip 5a is buried in the second interlayer insulating layer 42, a stress concentration to the edge portion of the semiconductor chip 5a can be avoided. When the semiconductor chip 5b whose side surface is formed like a step shape is employed, it is also similar.

Then, as shown in FIG. 17, an electronic component built-in substrate 2a of the second embodiment is obtained by carrying out the steps from FIG. 8 to FIG. 13 in the first embodiment.

In the electronic component built-in substrate 2a of the second embodiment, since the chamfered portion S is provided on the side surface upper portion of the semiconductor chip 5a, a stress generated around the semiconductor chip 5a when a heat is applied can be relaxed. As a result, it can be prevented that a crack is caused in the second interlayer insulating layer 42 (resin) around the semiconductor chip 5a, and reliability of the electronic component built-in substrate 2a can be improved.

What is claimed is:

1. An electronic component built-in substrate, comprising: a wiring substrate having a wiring layer; an electronic component mounted on the wiring substrate in a state that a connection pad is directed upward; an insulating layer formed on the wiring substrate and in which the electronic component is embedded up to a side surface upper portion thereof such that a whole of an upper surface of the electronic component is exposed from the insulating layer; and an upper wiring layer including an in-chip wiring part which is connected to the connection pad and contacts an upper surface of the electronic component and is constructed by an underlying metal pattern layer and a conductive pattern layer formed thereon, and an extended wiring part which is connected to the in-chip wiring part to extend onto the insulating layer and is formed by an identical layer with the conductive pattern layer wherein the underlying metal pattern layer is formed from an upper area of the connection pad to an edge of the electronic component, and the extended wiring part includes no said underlying metal pattern layer.

2. An electronic component built-in substrate according to claim 1, wherein the conductive pattern layer is constructed by a seed layer and a metal plating layer in order from a bottom.

3. An electronic component built-in substrate according to claim 1, wherein the extended wiring part is connected to the wiring layer of the wiring substrate via a via hole provided in the insulating layer.

4. An electronic component built-in substrate according to claim 1, wherein the electronic component is a semiconductor chip, and a protection insulating layer in which an opening portion is provided on the connection pad is formed under the underlying metal pattern layer.

5. An electronic component built-in substrate according to claim 1, wherein the underlying metal pattern layer is formed of a stacked film of any one of a titanium layer/a copper layer, and a chromium layer/a copper layer in order from a bottom.

* * * * *